(12) United States Patent
Nestorov et al.

(10) Patent No.: US 12,027,388 B2
(45) Date of Patent: Jul. 2, 2024

(54) CONICAL COIL FOR RAPID THERMAL ANNEAL LAMPS

(71) Applicant: Applied Materials, Inc., Santa Clara, CA (US)

(72) Inventors: Vilen K. Nestorov, Pleasanton, CA (US); Kaushik Rao, Bangalore (IN); Govinda Raj, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

(21) Appl. No.: 17/104,342

(22) Filed: Nov. 25, 2020

(65) Prior Publication Data

US 2021/0272822 A1 Sep. 2, 2021

Related U.S. Application Data

(60) Provisional application No. 62/984,076, filed on Mar. 2, 2020.

(51) Int. Cl.
*H01L 21/67* (2006.01)
*H01K 1/14* (2006.01)
(Continued)

(52) U.S. Cl.
CPC .......... *H01L 21/67115* (2013.01); *H01K 1/14* (2013.01); *H05B 3/0047* (2013.01); *H05B 3/0033* (2013.01); *H05B 3/0038* (2013.01); *H05B 2203/002* (2013.01); *H05B 2203/006* (2013.01); *H05B 2203/014* (2013.01)

(58) Field of Classification Search
None
See application file for complete search history.

(56) References Cited

U.S. PATENT DOCUMENTS 1,859,601 A * 5/1932 Rice .......................... H01K 1/14
338/234
2,454,765 A * 11/1948 Braunsdorff .......... F21S 41/166
362/296.07
(Continued)

FOREIGN PATENT DOCUMENTS

CN 104332382 A 2/2015
CN 104633492 A 5/2015
(Continued)

OTHER PUBLICATIONS

International Search Report and Written Opinion for PCT/US2020/061821 dated Mar. 19, 2021.
(Continued)

*Primary Examiner* — Joseph M. Pelham
(74) *Attorney, Agent, or Firm* — Patterson + Sheridan, LLP

(57) ABSTRACT

Examples disclosed herein relate to a lamp configured to provide heat for a processing chamber. The lamp includes a housing filled with a gas. A filament is disposed within the housing. The filament has an upper diameter, a lower diameter, and a length. A pair of electrodes is electrically coupled to the filament. A pair of pins is electrically coupled to the pair of electrodes. The pair of pins is configured to transfer energy to the filament. A ratio between either the upper diameter or the lower diameter to the length is about 0.3. The upper diameter is not equal to the lower diameter.

20 Claims, 5 Drawing Sheets

(51) Int. Cl.
*H05B 3/00* (2006.01)
*H05B 3/10* (2006.01)

(56) References Cited

U.S. PATENT DOCUMENTS

| | | | | |
|---|---|---|---|---|
| 4,959,585 A | * | 9/1990 | Hoegler | H01K 3/02 |
| | | | | 313/631 |
| 5,508,587 A | * | 4/1996 | Williams | H01K 1/50 |
| | | | | 313/271 |
| 6,600,255 B1 | * | 7/2003 | Kai | H01K 1/14 |
| | | | | 313/631 |
| 7,147,359 B2 | | 12/2006 | Ranish et al. | |
| 7,509,035 B2 | | 3/2009 | Ranish et al. | |
| 8,581,492 B2 | * | 11/2013 | Fudala | H01K 1/14 |
| | | | | 313/271 |
| 9,113,501 B2 | * | 8/2015 | Long | H01C 3/08 |
| 9,552,989 B2 | | 1/2017 | Koelmel et al. | |
| 10,076,002 B2 | * | 9/2018 | Schlipf | H05B 3/06 |
| 10,168,229 B2 | | 1/2019 | Raj et al. | |
| 10,477,622 B2 | * | 11/2019 | Boehmer | H05B 3/06 |
| 2006/0038471 A1 | * | 2/2006 | Buhler | H01K 1/14 |
| | | | | 313/271 |
| 2006/0066193 A1 | * | 3/2006 | Ranish | H01L 21/67115 |
| | | | | 313/116 |
| 2010/0102726 A1 | | 4/2010 | Hsieh | |
| 2012/0098407 A1 | * | 4/2012 | Fudala | H01K 1/14 |
| | | | | 313/271 |
| 2013/0223824 A1 | | 8/2013 | Myo | |
| 2013/0313246 A1 | * | 11/2013 | Long | H05B 3/52 |
| | | | | 219/544 |
| 2016/0111306 A1 | | 4/2016 | Ranish | |
| 2019/0096657 A1 | | 3/2019 | Ranish | |
| 2019/0110336 A1 | | 4/2019 | Cong et al. | |
| 2019/0200417 A1 | * | 6/2019 | Boehmer | H05B 3/82 |
| 2021/0285892 A1 | * | 9/2021 | Raj | G01N 21/8851 |
| 2023/0017852 A1 | * | 1/2023 | Nestorov | H01K 3/02 |

FOREIGN PATENT DOCUMENTS

| | | | | |
|---|---|---|---|---|
| CN | 105508894 A | * | 4/2016 | |
| GB | 1017828 A | * | 1/1966 | |
| JP | H09134707 A | | 5/1997 | |
| JP | 2000-340183 A | | 12/2000 | |
| JP | 2006-059813 A | | 3/2006 | |
| JP | 2009-117237 A | | 5/2009 | |
| JP | 2015146313 | | 8/2015 | |
| JP | 2015159292 | | 9/2015 | |
| JP | 2017011282 | | 1/2017 | |
| JP | 2017539069 A | | 12/2017 | |
| TW | 201013744 A | | 4/2010 | |

OTHER PUBLICATIONS

Taiwan Office Action dated Nov. 8, 2022 for Application No. 109145634.
Taiwan Office Action dated Jul. 7, 2023 for Application No. 109145634.
Japanese Office Action dated Nov. 7, 2023 for Application No. 2022-552542.
Taiwan Office Action dated Nov. 14, 2023 for Application No. 109145634.

\* cited by examiner

CONICAL COIL FOR RAPID THERMAL ANNEAL LAMPS

CROSS-REFERENCE TO RELATED APPLICATIONS

This application claims benefit of U.S. Provisional Application Ser. No. 62/984,076, filed Mar. 2, 2020, all of which are incorporated by reference in its entirety.

BACKGROUND

Field of Endeavor

Examples disclosed herein relate to a filament of a lamp configured to provide heat for a processing chamber.

Description of the Related Art

In substrate processing chambers, such as rapid thermal processing chambers, a quality of material deposited on a substrate can depend, among other things, on the uniformity of the temperature of the substrate. Control of a heat source is one manner of influencing a heat profile of the temperature across the substrate. A conventional heat source for rapid thermal processing includes lamps and reflectors. Dimensions such as the size, shape, and angle of the heat source are parameters that influence the heat profile across the substrate. When multiple heat sources are used in a processing chamber, control of such parameters can correspond to an overall quality of the heat profile, and therefore the quality of material deposited on the substrate.

Prior attempts to adjust parameters of the heat source for controlling the heat profile have been limited to the shape, length, and material of the heat source. The conventional heat source creates the heat profile across the substrate that does not promote the uniform deposition of deposited material. As such, in order to control center-to-edge uniformity of deposition material on the substrate, operators have turned to the control of other parameters in the processing chamber. However, control of these other parameters has resulted in an increase in the time required for routine maintenance. Accordingly, process yields have been adversely reduced due to the chamber down-time from the increase mean time between routine preventative maintenance procedures.

Therefore, there is a need for an improved heat source that improves the center to edge deposition uniformity on a substrate while reducing chamber downtime for preventative maintenance.

SUMMARY

Examples disclosed herein relate to a lamp configured to heat substrates disposed in a processing chamber. A lamp is configured to provide heat. The lamp includes a housing filled with a gas. A filament is disposed within the housing. The filament has an upper diameter, a lower diameter, and a length. A pair of electrodes is electrically coupled to the filament. A pair of pins is electrically coupled to the pair of electrodes. The pair of pins is configured to transfer energy to the filament. A ratio between either the upper diameter or the lower diameter to the length is about 0.3. The upper diameter is not equal to the lower diameter.

In another example, a lamp is configured to provide heat. The lamp includes a housing filled with a gas. A filament is disposed within the housing. The filament has a lower base and an upper base. A pair of electrodes is electrically coupled to the filament. A pair of pins is electrically coupled to the pair of electrodes. The pair of pins is configured to transfer energy to the filament. A ratio of a diameter of the lower base to a diameter of the upper base is greater than or equal to about 3:1.

In yet another example, a lamp includes a housing filled with a gas. A filament is disposed within the housing. The filament has a lower base and an upper base. A pair of electrodes is electrically coupled to the filament. A pair of pins is electrically coupled to the pair of electrodes. The pair of pins is configured to transfer energy to the filament. A ratio of a diameter of the lower base to a diameter of the upper base is equal to or less than about 1:3.

BRIEF DESCRIPTION OF THE DRAWING

So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Examples disclosed herein relate to a heat source, e.g., one or more lamps, configured to provide heat for a substrate disposed in a processing chamber. During processing, material may be deposited on the substrate disposed in the processing chamber using a variety of techniques. The lamps, positioned adjacent an interior volume of the processing chamber, are configured to emit radiant energy that heats the substrate while deposition material is deposited on the substrate.

Rapid thermal processing is one technique of depositing material in a processing chamber. The processing chamber uses lamps, controlled by variable electrical power, to heat the substrate. The lamps can provide radiation from the visible to the near-infrared range. The substrate absorbs radiation from the lamps, thus increasing the temperature of the substrate and suitability for deposition process. Each lamp includes a filament that is made of a material that radiates light and heat when an electric current is passed therethrough. The filament of the lamp is disposed in a gaseous environment that is selected to prolong the life of the filament.

A thickness uniformity of the deposited material on the substrate correlates to the uniformity of substrate temperature profile across the surface of the substrate during processing. Because the lamps are radiating heat, a geometry of a lamp filament of each lamp correlates to a radiation profile of the overall lamp, which can consequently, have an effect on the substrate temperature profile. The geometry of the lamp filament of each lamp, including a slope of the filament and the cross-section of the filament, has an effect on the local radiation per unit square meter (W/m$^2$) across the substrate. Accordingly, the geometry of each lamp filament can be used to control the uniformity of radiation profile provided by the lamps, and thus, also used to control the substrate temperature profile. By controlling the substrate temperature profile of the substrate during processing, the uniform deposition of material on the substrate is enabled. Moreover, by controlling the geometry of each lamp filament, the center-to-edge thickness of deposition material can be precisely controlled.

Advantageously, utilizing control parameters, such as the geometry, of the filament enable processing chambers to be fine-tuned to achieve desired deposition results. Moreover, the operators may readily change the radiation profile by replacing the lamps during routine maintenance procedures or for a particular process run. Furthermore, different lamps, i.e., having different filaments, may be utilized to compensate for other chamber processing disparities that may adversely affect film deposition uniformity.

Figure 1:
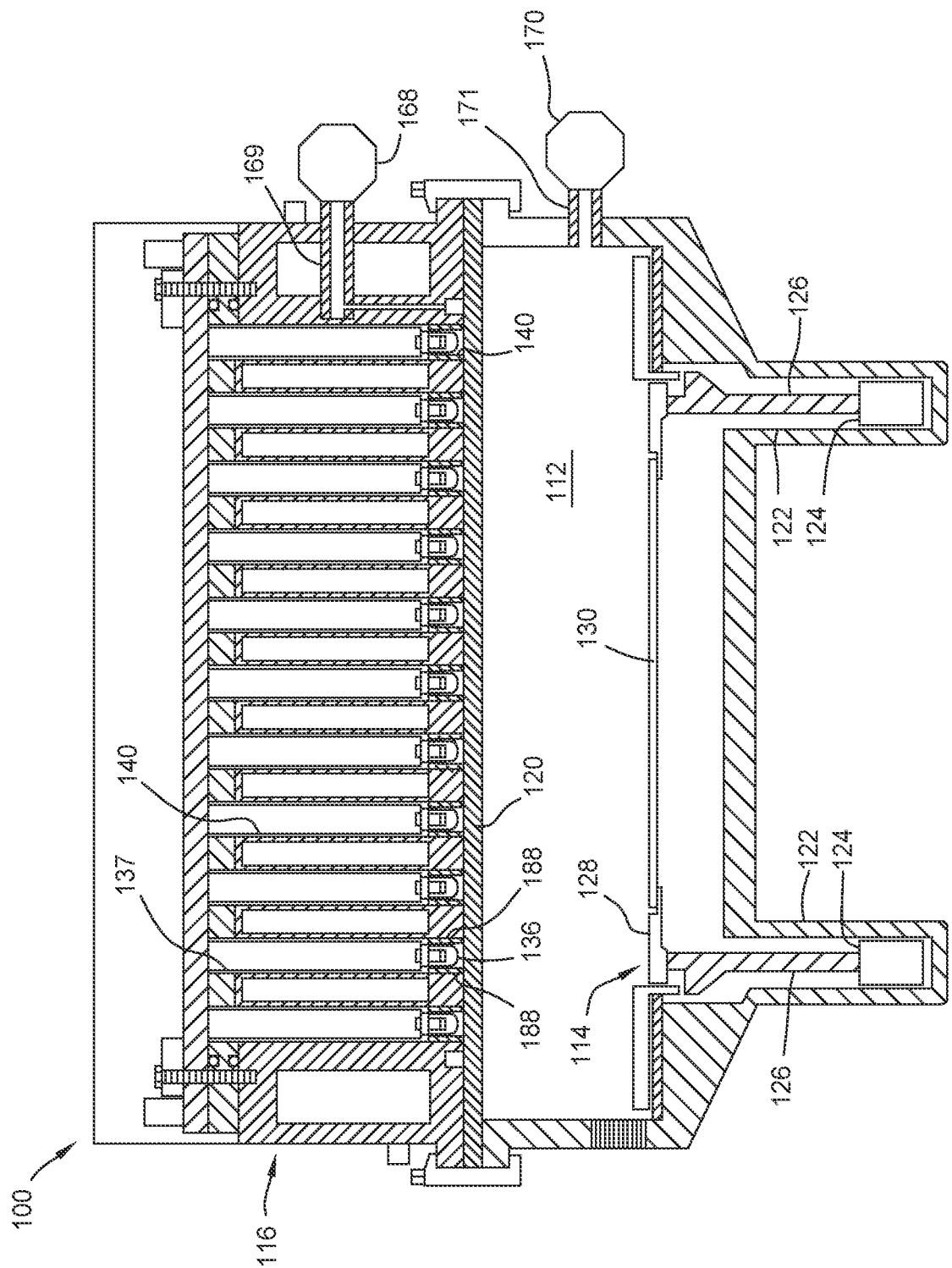
FIG. 1 is a schematic cross-sectional view of an exemplary processing chamber configured to deposit material on a substrate.

FIG. 1 is a schematic cross-sectional view of an exemplary processing chamber 100 configured to deposit material on a substrate 130. FIG. 1 provides context for the use of a light source (e.g., lamp 136) in a lamphead assembly 116 for heating the substrate 130 in the processing chamber 100. In one example, the processing chamber 100 is configured as a rapid thermal processing (RTP) chamber. It should be understood that the processing chamber 100 depicted herein is for illustrative purposes, and the concept of the present disclosure may benefit any thermal process chamber using the light source, such as the lamp 136, for emitting radiant energy to heat substrate 130 for processing. Although the lamps 136 are shown disposed in lamp tubes 137 positioned adjacent an internal volume 112 of the processing chamber 100 above the substrate 130, the lamps 136 may alternatively be positioned in the processing chamber 100 below, or above and below, the substrate 130. In the example of FIG. 1, the plurality of lamp tubes 137 is disposed within an internal volume 112 of the processing chamber 100. The internal volume 112 is generally the space enclosed by sidewalls and body (shown but not numbered) of the processing chamber 100, and separated from the lamp tubes 137 and lamps 136 by a window 120. The internal volume 112 may be held at pressure below atmospheric pressure.

The plurality of lamp tubes 137 are disposed in the lamphead assembly 116. The lamphead assembly 116 overlays the window 120. The window 120 separates the lamphead assembly 116 from the internal volume 112 of the processing chamber 100. A substrate handling apparatus 114 includes a rotor 124 disposed within a rotor channel 122, and a support cylinder 126 resting on or otherwise coupled to the rotor 124. The support cylinder 126 may be coated with a silicon quartz. The rotor 124 may be magnetically-levitated. An edge ring 128 rests on the support cylinder 126. The edge ring 128 may be made of silicon-coated silicon carbide. The edge ring 128 is configured to support the substrate 130 during processing.

The lamphead assembly 116 includes a lamp tube 137 and a lamp 136. The lamp 136 is disposed at one end of the lamp tube 137. The lamp tube 137 is configured to insert within the lamp housing tube 140. Alternatively, more than one lamp 136 may be housed within a respective one of the lamp housing tubes 140. Each lamp housing tube 140 can include a reflective inner surface, which may be a coating of silver or gold. The lamp housing tube 140 can be lined with a specular reflector 188. In one implementation, the lamps 136 are radiation emitting light bulbs such as tungsten-halogen lamps.

The atmosphere of the processing chamber 100 and of the lamphead assembly 116 can be controlled. For instance, a first vacuum pump 168 is provided to control, for example, reduce, the pressure in the lamphead assembly 116 through a first channel 169 that is in fluid communication with the lamphead assembly 116, as is shown in FIG. 1. A second vacuum pump 170 is provided to control, for example, reduce, the pressure in the lamphead assembly 116 through a second channel 171. In one implementation, to prevent tarnishing of the specular reflector 188, the atmosphere around the lamps 136 is controlled to substantially minimize the amount of sulfide-forming or sulfide-catalyzing materials on the silver used on the specular reflector 188. One way of preventing tarnishing of the specular reflector 188 is to ensure that the atmosphere is substantially free of $H_2S$ and moisture ($H_2O$). For example, by flowing helium through first channel 169, atmospheric air can substantially be prevented from entering the area around the lamps 136. In another example, a filter and/or getters may be disposed in the first channel 169 to remove $H_2S$ and moisture from the atmosphere surrounding the lamps 136. Sulfide getters, for example, including metal oxides such as iron oxide substantially prevent atmospheric air from entering the area around the lamp 136.

Figure 2:
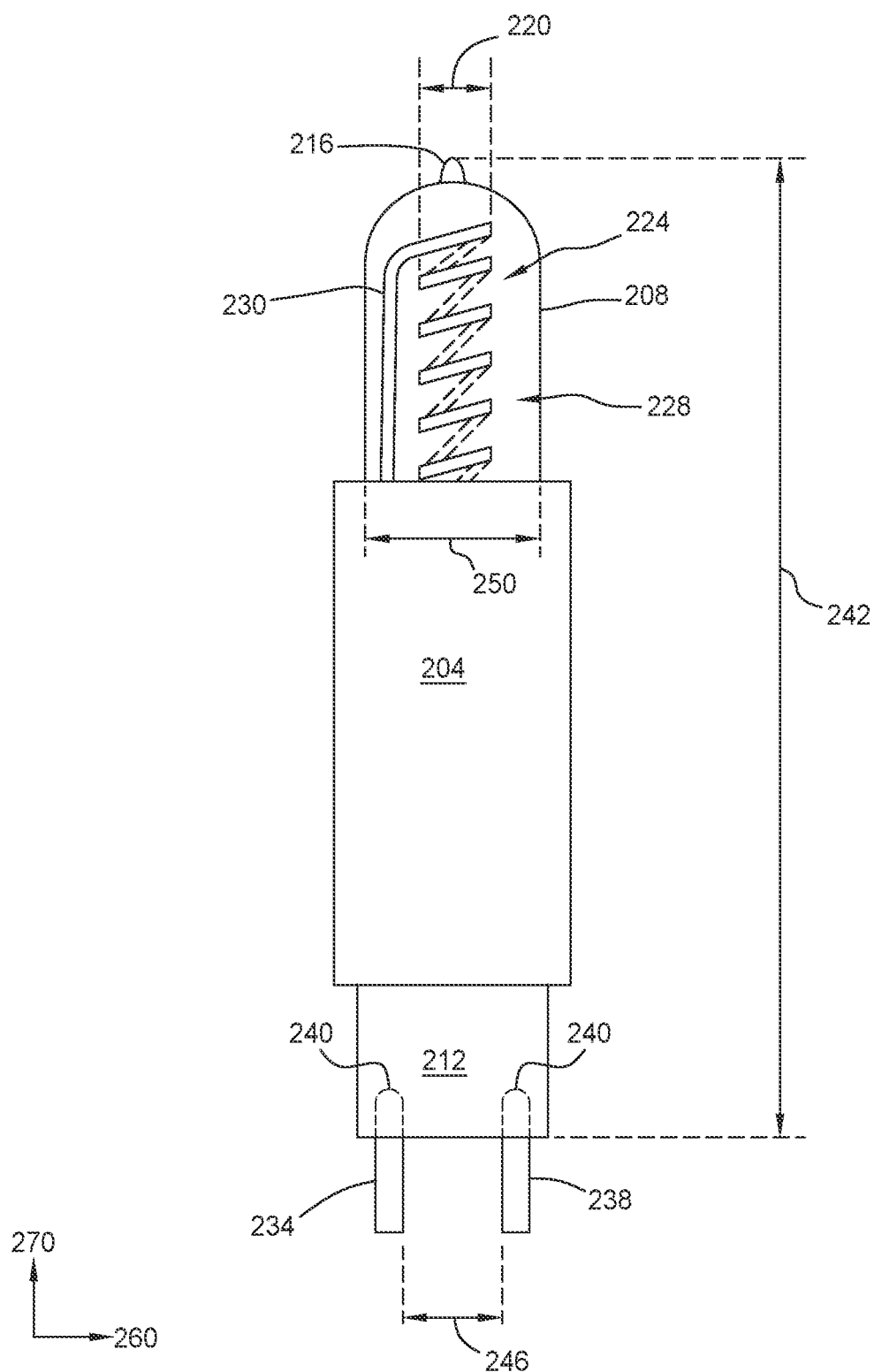
FIG. 2 is a frontal plan view of an exemplary lamp that can be used in the processing chamber of FIG. 1.

FIG. 2 is a frontal plan view of the exemplary lamp 136 that can be used in the processing chamber 100 of FIG. 1. The lamp 136 has a base 204, a housing 208, and a pin section 212. In one example, the housing 208 may be a dome in the general shape of cylinder, where one end of the cylinder may have a hemispherical end. The lamp 136 may also have a tip 216 at one end of the housing 208. In some examples, the housing 208 is made of quartz, or other suitable material.

The lamp 136 includes a filament 224 disposed within the housing 208. The filament 224 has an outer diameter 220. The filament 224 is formed from a wire 508 (shown in FIG. 5). The filament 224 includes a coiled section 228 that extends in a y-direction 270 within an interior of the housing 208. Stated differently, the coiled section 228 of the filament 224 extends in the y-direction 270 aligned with the long axis of the lamp 136. The coiled section 228 is substantially helical, but may have other shapes. The filament 224 is attached to a ground wire 230.

The pin section 212 includes a first pin 234 and a second pin 238. The first pin 234 and the second pin 238 are configured to be coupled to electrodes 240 disposed within the lamp housing tube 140. The base 204 may include electrodes, circuits, and other components necessary to couple the filament 224 and/or the ground wire 230 to the first pin 234 and the second pin 238.

A length 242 of the lamp 136 is defined between a distal end of the tip 216 to a bottom of the pin section 212 (excluding the pins 234, 238). The length 242 of the lamp 136 is between about 120 mm and 135 mm. In one example, the length 242 is about 125 mm. A width 246 between the first pin 234 and the second pin 238 is between about 6 mm to about 8 mm. The housing 208 has an exterior diameter 250 of between about 11 mm to about 17 mm. The outer diameter 220 of the coiled section 228 of the filament 224 is between about 3 mm to about 7 mm. It is contemplated that other geometries may be utilized for particular applications.

In operation, an electrical current is applied to the filament 224, causing the filament 224 to radiate light and heat. In some examples of the instant disclosure, the filament is made of tungsten or other suitable conductor. Tungsten filaments radiate infrared radiation at temperatures up to about 3,422° C. It is to be understood that other metals may be utilized without departing from the scope of the disclosure. The housing 208 (e.g., a quartz bulb) is filled with at least one gas that is configured to extend the lifetime of the filament 224. The gas may have a low level of reactivity, such as one or more noble gases. Other gases may also be present in the bulb. The gas(es) reduces the rate at which the filament 224 disintegrates, and therefore extends the lifetime of the lamp 136.

Figure 3:
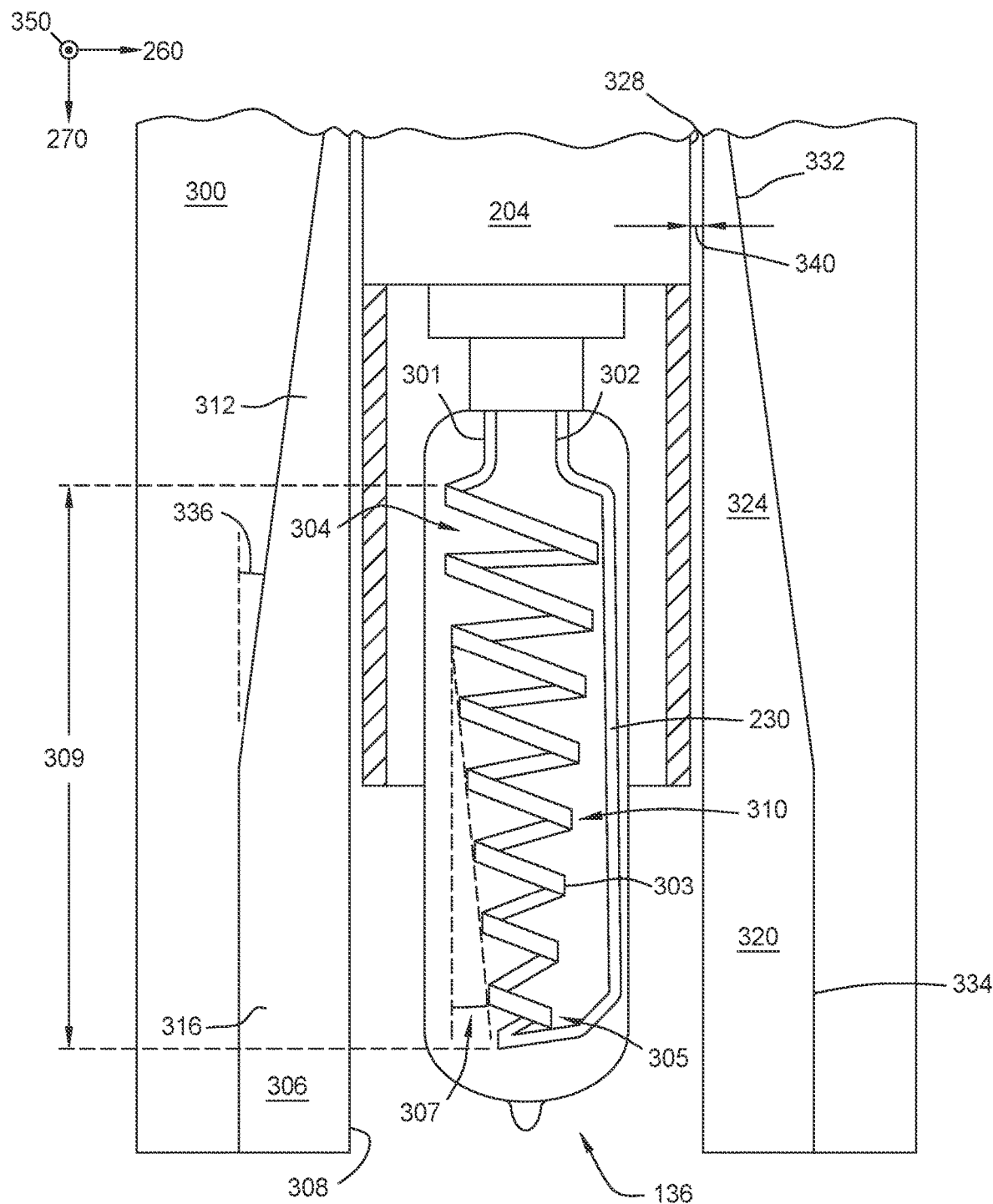
FIG. 3 is an enlarged, cross-sectional view of a filament that can be used in the lamp of FIG. 2 according to one example.

FIG. 3 is an enlarged, partial cross-sectional view of the lamphead assembly 116 illustrating a lamp 136 having another example of a filament 303. As shown in FIG. 1, the lamp 136 is illustrated disposed in a lamp housing tube 140. The open end of the lamp housing tube 140 is located adjacent to the window 120, and faces towards the substrate 130. In one implementation, a specular reflector 300 is disposed within the lamp housing tube 140 at the open end adjacent the window 120. Referencing FIGS. 1 and 3, the specular reflector 300 may be a separate part from the lamp housing tube 140. Alternatively, the specular reflector 300 can be an integral part of the lamp housing tube 140. The specular reflector 300 is fixed to the lamp housing tube 140 such that the specular reflector 300 is aligned with the lamp 136. As previously stated, the specular reflector 300 may be coated with gold or silver.

A first connector 301 of the filament 303 is electrically coupled to the first pin 234 through the base 204 (shown in FIG. 2). A second connector 302 is formed from a portion of the ground wire 230. The ground wire 230, which is electrically coupled to the filament 303, extends along a vertical length, i.e., the y-direction 270 from the filament 303 to the second connector 302. In the example of FIG. 3, the filament 303 is substantially in the shape of a frustum of a circular cone. A frustum may be formed from a right circular cone by cutting off the tip of the cone with a cut perpendicular to a height (e.g., a length 309), forming a lower base 304 and an upper base 305. The z-direction 350 is orthogonal to both the x-direction 260 and the y-direction 270. Cross-sections of the lower base 304 and upper base 305, taken along an x-z plane that includes the x-direction 260 and the z-direction 350, are substantially circular and coplanar to one another. A cross-section of the filament 303, taken along an x-y plane that includes the x-direction 260 and y-direction 270, is substantially in the shape of an isosceles trapezoid. As such, the lower base 304 and upper base 305 are substantially parallel. A length of a side 310 of the filament 303 is substantially equal to the length of its opposite side. As shown in FIG. 3, the upper base 305 is closer to the tip 216 of the housing 208 than the lower base 304. The filament 303 is oriented such that a narrower diameter of the filament 303 is closer to the substrate 130 than is a wider diameter of the filament 303. The narrower diameter is represented by the upper base 305. The wider diameter is the lower base 304.

A diameter of the lower base 304 can be about 11 mm to about 16 mm. A diameter of the upper base 305 can be about 1 mm to about 6 mm. A ratio of diameters of the lower base 304 to the upper base 305 can be about 7 to 1. However, the diameter ratio is not limited to the about 7 to 1 ratio and can include ratios from about 3 to 1 through about 7 to 1. The length 309 of the filament 303 can be about 18 mm to about 22 mm. A side 310 of the filament 303 can have a length of about 19 mm to about 23 mm. An angle 307 at which the side 310 is sloped is about 10 degrees to 20 about degrees. Accordingly, a complementary angle between the lower base 304 and the side 310 is about 60 degrees to about 80 degrees. The side 310 of the filament 303 tapers toward the centerline (not shown) of the filament 303. According to this orientation, the side 310 of the filament 303 tapers toward the tip 216 of the housing 208.

To enhance the optical efficiency of the lamp, the lamp housing tube 140 may include an insert tube 306. The insert tube 306 reflects and collimates radiant energy from the lamp 136 toward the substrate 130 to radiate an area of the substrate 130 (shown in FIG. 1). The insert tube 306 is provided between the specular reflector 300 and the lamp 136. The insert tube 306 may be attached to the specular reflector 300 via an adhesion layer (not shown). Alternatively, the insert tube 306 and/or the specular reflector 300 may include a suitable retention/engaging feature to removably engage or disengage the insert tube 306 with the specular reflector 300. For example, suitable retention/engaging features may include spring-loaded balls, spring contacts/pins, a slider, a notch, groove, or the like.

The insert tube 306 is disposed to surround the lamp 136. The insert tube 306 may have a constant inner diameter throughout the entire length of the insert tube 306. The outer surface of the insert tube 306 may have a profile that follows the shape of the specular reflector 300. In one implementation, the insert tube 306 has an upper portion 312 and a lower portion 316. The upper portion 312 may be conical shaped, and the lower portion 316 may be cylindrical shaped. The insert tube 306 may include a cylindrical lower portion 320 having a profile that follows the lower portion 316 of the specular reflector 300 and a tapered upper portion 324 having a profile that follows the conical shaped upper portion 312 of the specular reflector. The tapered upper portion 324 may be integrated with the cylindrical lower portion 320 as one body. In one implementation, the tapered upper portion 324 is generally extended upwardly or outwardly from the cylindrical lower portion 320 along the longitudinal direction of the cylindrical lower portion 320.

The tapered upper portion 324 of the insert tube 306 is defined by a taper angle 336 which can be approximately 1 degree to 45 degrees. For example, taper angle 336 can be about 3 degrees to about 20 degrees. In another example, the taper angle 336 can be about 6 degrees to about 10 degrees. The taper angle 336 described herein refers to an angle between a longitudinal direction of a second outer surface 332 of the tapered upper portion 324 and a longitudinal direction of a third outer surface 334 of the cylindrical lower portion 320. It is noted that the interpretation of the taper angle 336 as described herein should equally apply to other implementations of this disclosure.

As the taper angle 336 increases, the amount of energy reflecting or escaping from the lamp housing tube 140 increases, thereby increasing the optical efficiency of the lamp 136. The optical efficiency can be expressed by the energy on the target divided by the source energy. Taper angle 336 may be empirically optimized to provide uniform illumination, any desired spatial intensity profile, or desired lamp efficiency.

An inner surface 308 of the insert tube 306 may be formed into a tubular or cylindrical shape. In one implementation, the insert tube 306 is circular in cross section. The insert tube 306 may have a different shape in cross section such as a rectangle, a square, a triangle, or any suitable polygonal shape. The diameter of the inner surface 308 should be sufficient to accommodate the lamp 136 with a gap 340 between the inner surface 308 and a first outer surface 328 of the lamp's base 204. In one example, the gap 340 is about 0.5 mm to about 3 mm. The diameter of the inner surface 308 and the gap 340 may vary depending upon the size of the lamp 136. The specular reflector 300, the insert tube 306, and the lamp 136, once assembled or positioned in the lamp housing tube 140, are generally concentric or coaxial.

Advantageously, the filament geometry, orientation, taper angle 336, and other lamp parameters reduce the shadow effect and internal reflection of light and heat within the specular reflector 300. As such, the heat profile across the substrate 130 can be fine-tuned by adjusting the ratio between the diameter of the lower base 304 and the diameter of the upper base 305. Focusing a radiance of light and heat produced by the filament 303 increases center-to-edge heat profile uniformity across the substrate 130. A radiation profile of the filament 303 may have a variance between about 0.75 and about 5. A radiation profile may represented by a Gaussian distribution. As a ratio between the lower base 304 to the upper base 305 increases, the variance of the radiation profile increases. As the variance of the radiation profile increases, the radiation profile "flattens" with respect to the radiation profile created by the conventional lamp (not shown). Utilizing the filament 303, the radiation profile is substantially convex. The intensity of radiation is greater along the centerline of the filament 303, compared to outer diameter 220 of the filament 303. A diameter of the upper base 305 can be about 1 mm to about 6 mm. A diameter of the lower base 304 can be about 11 mm to about 16 mm. A ratio of the diameter of the lower base 304 to the diameter of the upper base 305 can be about 7 to 1. However, the ratio is not limited to the stated proportion and can include ratios from about 3 to 1 through about 7 to 1. A length 309 of the filament 303 can be less than or equal to about 22 mm. A side 310 of the filament 303 can have a length of less than or equal to about 23 mm. The conventional lamp collimates radiation along a centerline of the conventional lamp. The intensity of the radiation profile is highest along the centerline, and the radiation intensity decreases as the radius of the filament increases. A radiation profile of the conventional lamp causes deposited material to accumulate along the centerline of the conventional lamp, resulting in the non-uniform deposition of material on the substrate 130. For example, in the conventional lamp, a variance of the radiation profile may be less than 0.5.

Figure 4:
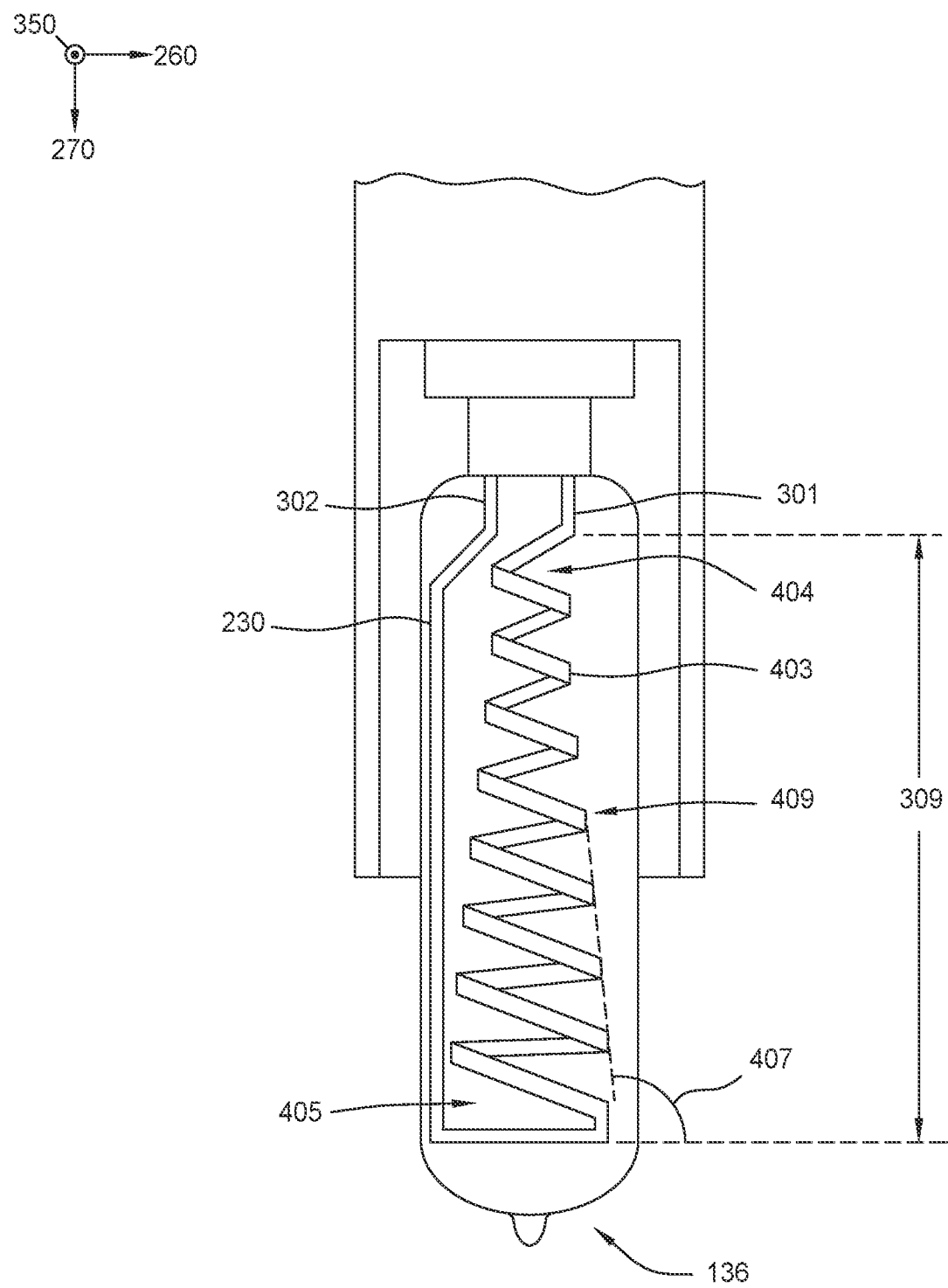
FIG. 4 is an enlarged, cross-sectional view of another filament that can be used in the lamp of FIG. 2 according to another example.

FIG. 4 is an enlarged, cross-sectional view of another filament 403 that can be used in the lamp 136 of FIG. 1. The filament 403 is similar to the filament 303 illustrated in FIG. 3. However, the orientation of the filament 403 is substantially inverted with respect to the orientation of the filament 303.

The first connector 301 is formed from the wire of the filament 403. The first connector 301 is electrically coupled to the first pin 234 (shown in FIG. 2). The second connector 302 is formed from a portion of the ground wire 230. The ground wire 230, which is electrically coupled to the filament 224, extends along a vertical length (i.e. y-direction 270). The filament 403 is substantially in the shape of an inverted frustum of a circular cone. The filament 403 has a lower base 404 and an upper base 405. Cross-sections of the lower base 404 and upper base 405, taken along the x-direction 260, are substantially circular and coplanar to one another. A cross-section of the filament 403, taken along the z-direction 350, is substantially in the form of an isosceles trapezoid. As such, the lower base 404 and upper base 405 are substantially parallel. A length of a side 409 of the filament 403 is substantially equal to the length of its opposite side. As shown in FIG. 4, the upper base 405 is closer to the tip 216 of the housing 208 than the lower base 404. The filament 403 is oriented such that a wider diameter of the filament 403 is closer to the substrate 130 than is a narrower diameter of the filament 403. The narrower diameter is represented by the lower base 404. The wider diameter is the upper base 405.

The filament 403 increases center-to-edge heat profile uniformity across the substrate 130. A radiation profile of the filament 403 may have a variance between about 0.75 and about 5. However, the radiation profile of the filament 403 is substantially concave. The intensity of radiation is greater along the outer diameter 220 of the filament 403 than the centerline of the filament 403. Similar to examples above, as a ratio between the diameter of the lower base 404 to the diameter of the upper base 405 increases, the variance of the radiation profile increases. As the variance of the radiation profile increases, the radiation profile flattens and inverts with respect to the radiation profile created by the conventional lamp. Accordingly, the radiation profile created by the filament 403 is substantially inverted with respect to the radiation profile created by the filament 303.

A diameter of the lower base 404 can be about 1 mm to about 6 mm. A diameter of the upper base 405 can be about 11 mm to about 16 mm. A ratio of the diameter of the lower base 404 to the diameter of the upper base 405 can be about 1 to 7. However, the ratio is not limited to proportion and can include ratios from about 1 to 3 through about 1 to 7. As stated above, the length 309 of the filament 403 can be less than or equal to about 21.0 mm. A side 409 of the filament 403 can have a length of less than or equal to about 22.5 mm. An angle 407 at which the side 409 is sloped is about 100 to 110 degrees. Accordingly, a complementary angle between the lower base 404 and the side 409 is about 70 degrees to about 80 degrees. The side 409 of the filament 403 tapers away from the centerline (not shown) of the filament 403. As such, the side 409 of the filament 403 tapers away from the tip 216 of the housing 208.

Figure 5:
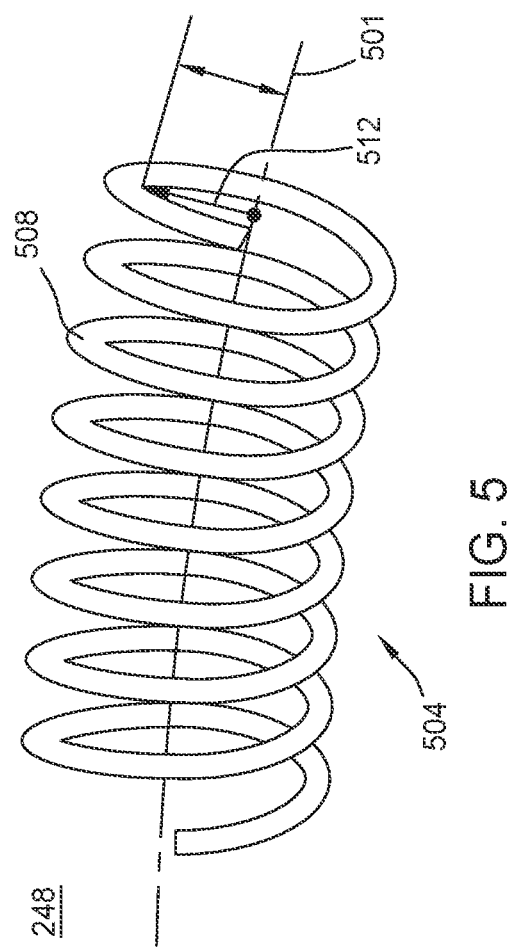
FIG. 5 is an expanded view of a portion of the filament utilized in the exemplary lamp of FIGS. 2-4.

FIG. 5 is an expanded view of a portion of the coiled section 248 of the filament 224 utilized in the exemplary lamp 136 of FIGS. 2-4. In FIG. 5, a segment 504 of the filament 224 is illustrated. It is to be understood that discussion of the segment 504 necessarily represents the filaments 224, 303, and 403, and discussion of the filaments 224, 303, and 403, is also attributable to the segment 504. The segment 504 of the filament is made of a wire 508. In some examples, the wire 508 is wound at a substantially constant radius 512 from a central axis 501. The central axis 501 is substantially helical, such that when the segment 504 is extended for along a length of the filament 224, the coiled section 228 of the filament 224 is formed by the central axis 501 of the wire 508 being wound around the long axis of lamp 136 that extends in the y-direction 270 (shown in FIG. 2). The wire 508 may have a thickness (i.e., a diameter) between about 0.03 and about 0.07 mm.

Disclosed herein is a lamp having a filament configured to tune the temperature profile induced on substrates heated in

What we claim is:

1. A lamp configured to provide heat, the lamp comprising:
   a housing filled with a gas;
   a filament disposed within the housing and having an upper diameter, a lower diameter, and a length, the length being about 18 mm to about 22 mm;
   a pair of electrodes electrically coupled to the filament; and
   a pair of pins electrically coupled to the pair of electrodes, the pair of pins configured to transfer energy to the filament, wherein:
      the lower diameter is closer to the pair of pins than the upper diameter, and
      a ratio of the lower diameter to the length is about 0.3, and the upper diameter is not equal to the lower diameter.

2. The lamp according to claim 1, wherein the filament comprises: a coil wire having a diameter less than or equal to about 0.07 mm.

3. The lamp according to claim 1, wherein the lamp has a length of between about 120 mm and about 135 mm.

4. The lamp according to claim 1, wherein the filament has an outer diameter between about 3 mm to about 7 mm.

5. The lamp according to claim 1, wherein the housing has an outer diameter of about 11 mm to about 17 mm.

6. The lamp according to claim 1, wherein the length is less than 15 mm and greater than 10 mm, and wherein either of the upper diameter or the lower diameter is less than about 7 mm and greater than about 3 mm.

7. A lamp configured to provide heat, the lamp comprising:
   a housing filled with a gas;
   a filament disposed within the housing and having a lower base and an upper base;
   a pair of electrodes electrically coupled to the filament; and
   a pair of pins electrically coupled to the pair of electrodes, wherein:
      the pair of pins is configured to transfer energy to the filament,
      the lower base is closer to the pair of pins than the upper base, and
      a ratio of a diameter of the lower base to a diameter of the upper base is greater than or equal to about 3:1.

8. The lamp according to claim 7, wherein the filament comprises a coil wire having a diameter less than or equal to about 0.05 mm.

9. The lamp according to claim 7, wherein the lamp has a length of between about 120 mm and about 135 mm.

10. The lamp according to claim 7, wherein the filament has an outer diameter of between about 3 mm to about 7 mm.

11. The lamp according to claim 7, wherein the housing has an outer diameter of about 11 mm to about 17 mm.

12. The lamp according to claim 7, wherein the filament is substantially oriented as a frustum of a cone.

13. The lamp according to claim 12, wherein the filament has a side that is sloped at an angle between about 10 degrees and about 20 degrees with respect to the lower base.

14. A lamp comprising:
   a housing filled with a gas;
   a filament disposed within the housing and having a lower base and an upper base, wherein the filament comprises a coil wire having a diameter of about 0.03 mm to about 0.07 mm;
   a pair of electrodes electrically coupled to the filament; and
   a pair of pins electrically coupled to the pair of electrodes, wherein:
      the pair of pins is configured to transfer energy to the filament,
      the lower base is closer to the pair of pins than the upper base, and
      a ratio of a diameter of the lower base to a diameter of the upper base is equal to or less than about 1:3.

15. The lamp according to claim 14, wherein the lamp has a length between about 125 mm and about 135 mm.

16. The lamp according to claim 14, wherein the filament has an outer diameter between about 3 mm to about 7 mm.

17. The lamp according to claim 14, wherein the housing has an outer diameter of about 11 mm to about 17 mm.

18. The lamp according to claim 14, wherein the filament is substantially oriented as a frustum of a cone.

19. The lamp according to claim 18, wherein the filament has a side that is sloped at an angle of less than about 80 degrees and greater than about 60 degrees with respect to the lower base.

20. The lamp according to claim 14, wherein the length of the filament is less than or equal to about 22 mm.

* * * * *